(12) United States Patent
Noble

(10) Patent No.: US 6,242,775 B1
(45) Date of Patent: *Jun. 5, 2001

(54) CIRCUITS AND METHODS USING VERTICAL COMPLEMENTARY TRANSISTORS

(75) Inventor: Wendell P. Noble, Milton, VT (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/028,805

(22) Filed: Feb. 24, 1998

(51) Int. Cl.$^7$ .................................................. H01L 31/119
(52) U.S. Cl. ........................ 257/330; 257/351; 257/374
(58) Field of Search ..................................... 257/329, 330, 257/331, 332, 333, 350, 351, 374

(56) References Cited

U.S. PATENT DOCUMENTS

| | | | |
|---|---|---|---|
| 4,051,354 | 9/1977 | Choate | 235/312 |
| 4,604,162 | 8/1986 | Sobczak | 156/657 |
| 4,663,831 | 5/1987 | Birrittella et al. | 29/576 E |
| 4,673,962 | 6/1987 | Chatterjee et al. | 357/23.6 |
| 4,701,423 | * 10/1987 | Szluk | 437/57 |
| 4,716,314 | 12/1987 | Mulder et al. | 307/477 |
| 4,761,768 | 8/1988 | Turner et al. | 365/201 |
| 4,766,569 | 8/1988 | Turner et al. | 365/185 |
| 4,845,537 | 7/1989 | Nishimura et al. | 357/23.4 |
| 4,920,065 | 4/1990 | Chin et al. | 437/52 |
| 4,949,138 | 8/1990 | Nishimura | 357/23.6 |
| 4,987,089 | 1/1991 | Roberts | 437/34 |
| 5,001,526 | 3/1991 | Gotou | 357/23.6 |

(List continued on next page.)

FOREIGN PATENT DOCUMENTS 363066963A   3/1988  (JP).

OTHER PUBLICATIONS

Richardson, W.F., et al., "A Trench Transistor Cross–Point DRAM Cell", *1985 IEEE International Electron Devices Meeting*, Washington, D.C., 714–717, (Dec. 1–4, 1985).

Terauchi, M., et al., "A Surrounding Gate Transistor (SGT) Gain Cell for Ultra High Density DRAMs", 1993 Symposium on VLSI Technology, Digest of Technical Papers, Kyoto, Japan 21–22, (1993).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", 1996 Symposium on VLSI Technology, Digest of Technical Papers, Honolulu, HI, 240–241, (Jun. 11–13, 1996).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices*, 38, 2487–2496, (Nov. 1991).

(List continued on next page.)

*Primary Examiner*—Sara Crane
(74) *Attorney, Agent, or Firm*—Schwegman, Lundberg, Woessner & Kluth, P.A.

(57) ABSTRACT

A method and structure for an improved, vertically configured inverter array is provided. The inverter includes a buried gate contact coupling the body regions of a complementary pair of transistors. An electrical contact couples the second source/drain regions of the complementary pair of transistors. The transistors are formed in vertical pillars of single crystalline semiconductor material.

19 Claims, 16 Drawing Sheets

U.S. PATENT DOCUMENTS

| | | | |
|---|---|---|---|
| 5,006,909 | 4/1991 | Kosa | 357/23.6 |
| 5,010,386 | 4/1991 | Groover, III | 357/42 |
| 5,017,504 | 5/1991 | Nishimuro et al. | 437/40 |
| 5,021,355 | 6/1991 | Dhong et al. | 437/35 |
| 5,028,977 | 7/1991 | Kenneth et al. | 357/43 |
| 5,072,269 | 12/1991 | Hieda | 257/302 |
| 5,087,581 | 2/1992 | Rodder | 437/41 |
| 5,102,817 | 4/1992 | Chatterjee et al. | 437/47 |
| 5,110,752 | 5/1992 | Lu | 437/47 |
| 5,156,987 | 10/1992 | Sandhu et al. | 437/40 |
| 5,177,028 | 1/1993 | Manning | 437/41 |
| 5,177,576 | 1/1993 | Kimura et al. | 257/71 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,223,081 | 6/1993 | Doan | 156/628 |
| 5,266,514 | 11/1993 | Tuan et al. | 437/52 |
| 5,308,782 | 5/1994 | Mazure et al. | 437/52 |
| 5,316,962 | 5/1994 | Matsuo et al. | 438/245 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,416,736 | 5/1995 | Kosa et al. | 365/174 |
| 5,422,296 | 6/1995 | Lage | 437/52 |
| 5,422,499 | 6/1995 | Manning | 257/67 |
| 5,432,739 | 7/1995 | Pein | 365/185 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,519,236 | 5/1996 | Ozaki | 257/302 |
| 5,528,062 | 6/1996 | Hsieh et al. | 257/298 |
| 5,563,083 | 10/1996 | Pein | 437/43 |
| 5,574,299 | 11/1996 | Kim | 257/296 |
| 5,576,238 | 11/1996 | Fu | 437/52 |
| 5,581,101 | * 12/1996 | Ning et al. | 257/347 |
| 5,593,912 | 1/1997 | Rajeevakumar | 437/52 |
| 5,616,934 | 4/1997 | Dennison et al. | 257/67 |
| 5,627,097 | * 5/1997 | Venkatesan et al. | 438/217 |
| 5,637,898 | 6/1997 | Baliga | 257/330 |
| 5,640,342 | 6/1997 | Gonzalez | 365/156 |
| 5,644,540 | 7/1997 | Manning | 365/200 |
| 5,646,900 | 7/1997 | Tsukude et al. | 365/205 |
| 5,674,769 | 10/1997 | Alsmeier et al. | 437/52 |
| 5,691,230 | 11/1997 | Forbes | 437/62 |
| 5,705,415 | 1/1998 | Orlowski et al. | 437/43 |
| 5,753,947 | 5/1998 | Gonzalez | 257/296 |
| 5,864,158 | * 1/1999 | Liu et al. | 257/330 |
| 5,909,618 | 6/1999 | Forbes et al. | 438/242 |
| 5,914,511 | 6/1999 | Noble et al. | 257/302 |
| 5,917,342 | * 6/1999 | Okamura | 326/103 |
| 5,920,088 | 7/1999 | Augusto | 257/192 |
| 5,936,274 | 8/1999 | Forbes et al. | 257/315 |
| 5,963,469 | 10/1999 | Forbes | 365/149 |
| 5,973,352 | 10/1999 | Noble et al. | 257/315 |
| 5,973,356 | 10/1999 | Noble et al. | 257/319 |
| 6,100,123 | * 8/2000 | Bracchitta et al. | 438/199 |

OTHER PUBLICATIONS

Wang, N., *Digital MOS Integrated Circuits*, Prentice Hall, Inc., Englewood Cliffs, NJ, pp. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanbe, H., et al., "A Novel Stacked Capacitor with Porous–Si Electrodes for High Density DRAMs", 1993 Symposium on VLSI Technology, Digest of Technical Papers, Kyoto, Japan, 17–18, (1993).

Watanbe, H., et al., "An Advanced Fabrication Technology of Hemispherical Grained (HSG) Poly–Si for High Capacitance Storage Electrodes", Extended Abstracts of the 1991 International Conference on Solid State Devices and Materials, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", Extended Abstracts of the 1992 International Conference on Solid State Devices and Materials, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Sherony, M.J., et al. "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", 1997 IEEE International Solid–State Circuits Conference, Digest of Technical Papers, 68–69, (Feb. 6, 1997).

Stellwag, T.B., et al., "A Vertically–Integrated GaAs Bipolar DRAM Cell", *IEEE Transactions on Electron Devices*, 38, 2704–2705, (Dec. 1991).

Suma, K., et al., "An SOI–DRAM with Wide Operating Voltage Range by CMOS/SIMOX Technology", *IEEE Journal of Solid–State Circuits*, 29, 1323–1329, (Nov. 1994).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", *1988 IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", 1995 Symposium on VLSI Technology, Digest of Technical Papers, Kyoto, Japan, 123–124, (Jun. 6–8, 1995).

Temmler, D., "Multilayer Vertical Stacked Capacitors (MVSTC) for 64Mbit and 256Mbit DRAMs", 1991 Symposium on VLSI Technology, Digest of Technical Papers, Oiso, 13–14, (May 28–30, 1991).

Oowaki, Y., et al., "New α–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D Pencil Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", *IEEE International Electron Devices Meeting, Technical Digest*, 11–14, (1993).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Sagara, K., et al., "A 0.72 $\mu m^2$ Recessed STC (RSTC) Technology for 256Mbit DRAMs using Quarter–Micron Phase–Shift Lithography", 1992 Symposium on VLSI Technology, Digest of Technical Papers, Seattle, WA, 10–11, (Jun. 2–4, 1992).

Saito, M., et al., "Technique for Controlling Effective Vth in Multi–Gbit DRAM Sense Amplifier", 1996 Symposium on VLSI Circuits, Digest of Technical Papers, Honolulu, HI, 106–107, (Jun. 13–15, 1996).

Shah, A.H., et al., "A 4–Mbit DRAM with Trench–Transistor Cell", *IEEE Journal of Solid–State Circuits*, SC–21, 618–625, (Oct. 1986).

Shah, A.H., et al., "A 4Mb DRAM with Cross–Point Trench Transistor Cell", 1986 IEEE International Solid–State Circuits Conference, Digest of Technical Papers, 268–269, (Feb. 21, 1986).

Kohyama, Y., et al., "Buried Bit–Line Cell for 64MB DRAMs", 1990 Symposium on VLSI Technology, Digest of Technical Papers, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31, 586–591, (Apr. 1996).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *J. Electrochem. Soc.*, 140, 2836–2843, (Oct. 1993).

Lu, N., et al., "The SPT Cell—A New Substrate–Plate Trench Cell for DRAMs", *1985 IEEE International Electron Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Φ–Shape Transistor (VΦT) Cell for 1 Gbit DRAM and Beyond", 1994 Symposium of VLSI Technology, Digest of Technical Papers, Honolulu, HI, 133–134, (Jun. 7–9, 1994).

Maeda, S., et al., "Impact of a Vertical Φ–Shape Transistor (VΦT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Hisamoto, D., et al., "A New Stacked Cell Structure for Giga–Bit DRAMs using Vertical Ultra–Thin SOI (DELTA) MOSFETs", 1991 IEEE International Electron Devices Meeting, Technical Digest, Washington, D.C., 959–961, (Dec. 8–11, 1991).

Hodges, D.A., et al., "MOS Decoders", In: *Analysis and Design of Digital Integrated Circuits, 2nd Edition*, McGraw–Hill Book Co., New York, 354–357, (1988).

Holman, W.T., et al., "A Compact Low Noise Operational Amplifier for a 1.2 $\mu$m Digital CMOS Technology", *IEEE Journal of Solid–State Circuits*, 30, 710–714, (Jun. 1995).

Hu, G., et al., "Will Flash Memory Replace Hard Disk Drive?", *1994 IEEE International Electron Device Meeting*, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm² 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Burnett, D., et al., "Statistical Threshold–Voltage Variation and its Impact on Supply–Voltate Scaling", Proceedings SPIE: Microelectronic Device and Multilevel Interconnection Technology, 2636, 83–90, (1995).*

Chen, M.J., et al., "Back–Gate Forward Bias Method for Low–Voltage CMOS Digital Cicuits", *IEEE Transactions on Electron Devices*, 43, 904–909, (Jun. 1986).*

Chen, M.J., et al., "Optimizing the Match in Weakly Inverted MOSFET's by Gated Lateral Bipolar Action", *IEEE Transactions on Electron Devices*, 43, 766–773, (May 1996).*

Chung, I.Y., et al., "A New SOI Inverter for Low Power Applications", Proceedings of the 1996 IEEE International SOI Conference, Sanibel Island, FL, 20–21, (Sep. 30–Oct. 3, 1996).*

De, V.K., et al., "Random MOSFET Parameter Fluctuation Limits to Gigascale Integration (GSI)", 1996 Symposium on VLSI Technology, Digest of Technical Papers, Honolulu, HI, 198–199, (Jun. 11–13, 1996).*

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).*

Fong, Y., et al., "Oxides Grown on Textured Single–Crystal Silicon—Dependence on Process and Application in EEPROMs", *IEEE Transactions on Electron Devices*, 37, 583–590, (Mar. 1990).*

Fuse, T., et al., "A 0.5V 200MHz 1–Stage 32b ALU Using a Body Bias Controlled SOI Pass–Gate Logic", 1997 IEEE International Solid–State Circuits Conference, Digest of Technical Papers, 286–287, (1997).*

Gong, S., et al., "Techniques for Reducing Switching Noise in High Speed Digital Systems", Proceedings of the 8th Annual IEEE International ASIC Conference and Exhibit, 21–24, (1995).*

Hao, M.Y., et al., "Electrical Characteristics of Oxynitrides Grown on Textured Single–Crystal Silicon", *Appl. Phys. Lett.*, 60, 445–447, (Jan. 1992).*

Harada, M., et al., "Suppression of Threshold Voltage Variation in MTCMOS/SIMOX Circuit Operating Below 0.5 V", 1996 Symposium on VLSI Technology, Digest of Technical Papers, Honolulu, HI, 96–97, (Jun. 11–13, 1996).*

Adler, E., et al., "The Evolution of IBM CMOS DRAM Technology", *IBM Journal of Research and Devlopment*, 39, 167–188, (Jan./Mar. 1995).

Asai, S., et al., "Technology Challenges for Integration Near and Below 0.1 $\mu$m", Proceedings of the IEEE, 85, Special Issue on Nanometer–Scale Science & Technology, 505–520, (Apr. 1997).

Banerjee, S.K., et al., "Characterization of Trench Transistors for 3–D Memories", 1986 Symposium on VLSI Technology, Digest of Technical Papers, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27, 618–625, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", 1994 Symposium on VLSI Technology, Digest of Technical Papers, Honolulu, HI, 15–16, (Jun. 4–7, 1994).

* cited by examiner

US 6,242,775 B1

CIRCUITS AND METHODS USING VERTICAL COMPLEMENTARY TRANSISTORS

FIELD OF THE INVENTION

The present invention relates generally to semiconductor integrated circuits. More particularly, it pertains to circuits and methods using vertical, complementary transistors.

BACKGROUND OF THE INVENTION

Integrated circuit technology relies on transistors to formulate vast arrays of functional circuits. The complexity of these circuits requires the use of an ever increasing number of linked transistors. As the number of transistors required increases, the surface area that can be dedicated to a single transistor dwindles. It is desirable then, to construct transistors which occupy less surface area on the silicon chip/die.

Integrated circuit technology uses transistors conjunctively with Boolean algebra to create a myriad of functional digital circuits, also referred to as logic circuits. In a typical arrangement, transistors are combined to switch or alternate an output voltage between just two significant voltage levels, labeled logic 0 and logic 1. Most logic systems use positive logic, in which logic 0 is represented by zero volts, or a low voltage, e.g., below 0.5 V; and logic 1 is represented by a higher voltage.

One method in which these results are achieved involves Complementary Metal-Oxide Semiconductor (CMOS) technology. CMOS technology comprises a combination of oppositely doped Metal-Oxide Semiconductor Field-Effect Transistors (MOSFETs) to achieve the switching mechanism between voltage levels associated with logic 0 and that of logic 1. This configuration is likewise referred to as an inverter. Conventional CMOS inverters consume an appreciable amount of chip surface area, even despite ongoing reductions in the critical dimensions that are achievable with conventional photolithography techniques. The critical dimension (F) represents the minimum lithographic feature size that is imposed by lithographic processes used during fabrication.

Some companies have dabbled with use of vertical transistors, but have limited the use to circuits such as memories. The use of vertical transistors in memories generally focuses on the placement, arrangement and size of the charge storage node. The charge storage node is conventionally a capacitor of one form or another. Capacitors have individual space requirements and obstacles which have to be overcome in order to retain data stored under low power supplies. Logic circuit transistors similarly have individual space requirements and obstacles which have not been addressed.

Accordingly, what is needed is improved configuration for transistors, suitable for use in logic circuits, which will conserve surface space on the semiconductor die.

SUMMARY OF THE INVENTION

In one embodiment, an inverter is provided. The inverter comprises a first vertically configured transistor extending outwardly from a semiconductor substrate and a second vertically configured transistor similarly extending outward from the semiconductor substrate. There is provided electrical contact between source/drain regions of the first and second vertically configured transistors to provide an output for the inverter, and a gate contact is included. The gate contact interconnects the vertically configured transistors wherein the gate contact comprises an input to the inverter.

The vertically configured transistors each have a number of sides, first and second source/drain regions, a body region and a gate. The first and second transistors are contained in separate pillars of single crystalline semiconductor material. The gate contact interconnects the gates of the first and second transistors. In the inverter the body region and first and second source/drain regions of the second transistor are oppositely doped from the corresponding body region and first and second source/drain regions of the first transistor.

In another embodiment, an inverter array is provided. The array comprises multiple complementary pairs of transistors extending outwardly from a semiconductor substrate. The multiple complementary pairs have upper surfaces and each transistor in a pair has a vertically stacked body region, and first and second source/drain region and a gate. There is provided an electrical contact between the source/drain regions of the transistors in each complementary pair. This electrical contact is found between the second source/drain regions of the transistors in each complementary pair and further includes an output to other ones of the multiple complementary pairs of transistors. A plurality of isolation trenches extend parallel to and separate the multiple complementary pairs of transistors. A gate contact is provided for each complementary pair of transistors. The gate contact communicates with the body region of each transistor in the complementary pair and further includes an electrical input adapted to receive electrical signals from both external sources as well as other ones of the multiple complementary pairs of transistors. The gate contact is located below the upper surface of the multiple complementary pairs of transistors.

Another embodiment includes an integrated logic circuit. The logic circuit has multiple complementary pairs of transistors extending outwardly from the substrate having an upper surface. Each transistor in the complementary pairs includes a vertically stacked body region between first and second source/drain regions. A gate contact is shared between each complementary pair of transistors. This gate contact couples to the body region of each transistor in the pair. As above in the array, the gate contact is below the upper surface of the multiple complementary pairs of transistors. The gate contact also includes an input. An electrical contact couples each transistor in the complementary pair of transistors such that each complementary pair of transistors forms an inverter. An output for the inverter is connected to the electrical contact. A metallization layer selectively interconnects the inputs and outputs of the inverters to form a logic circuit that accepts inputs and produces one or more logical outputs.

In another embodiment, an input/output device is provided. The input/output device comprises a functional circuit having a plurality of components. A logic device couples to the functional circuit. This logic device has at least one inverter. The inverter included in the logic device further comprises a complementary pair of transistors extending outwardly from a semiconducting substrate. Each complementary pair has an upper surface. Each transistor in the complementary pair has a body region vertically stacked between first and second source/drain regions and has a gate region. There is a gate contact which couples the gates in each complementary pair of transistors. The gate contact is below the upper surface of the multiple complementary pairs of transistors and the gate contact has an input for each inverter. There is an electrical contact between the second source/drain region in each complementary pair of transistors. This electrical contact has an output for the inverter. A metallization layer is included that selectively interconnects the inputs and outputs of selected inverters in the array to implement the logical function and form the functional circuit.

In another embodiment, a method of fabricating an inverter device is provided. The method includes forming a first transistor in a first pillar of single crystalline semiconductor material that extends outwardly from a substrate and forming a second transistor in a second pillar of single crystalline semiconductor material that extends outwardly from the substrate. Both the first and second pillar are formed with a number of sides. The method includes forming the first and second transistor to include a body region as well as first and second source/drain regions that are vertically aligned. The method includes forming the first and second transistors to include a region associated with a side of the transistors. A gate contact is formed so as to communicate with the gate regions of both first and second transistors. A metal contact is formed between the first and second transistors. The method includes forming the first and second transistors by selectively growing multiple epitaxial layers of differently doped silicon. The first and second transistors are formed so that the complementary body regions and first and second source/drain regions of the first and second transistors are differently doped.

In another embodiment, there is provided a method for fabricating an inverter array which comprises forming multiple complementary pairs of transistors extending outwardly from a semiconductor substrate. The multiple complementary pairs are formed with upper surfaces. The method includes forming each transistor in a pair to have a vertically stacked body region, first and second source/drain regions and a gate region. An electrical contact is formed between transistors in each complementary pair. The method of forming the electrical contact includes forming an electrical output which couples to other ones of the multiple complementary pairs. The method includes forming a plurality of isolation trenches to extend parallel to and between the multiple complementary pairs of transistors. A gate contact is also formed in each complementary pair of transistors. The gate contact communicates with the body region of each transistor in the pair. The method of forming a gate contact further includes forming an electrical input, connected to the gate contact, and adapted to receive electrical input from both external sources as well as other ones of the multiple complementary pairs of transistors.

The improved inverter structure conserves precious surface space on the wafer by vertically constructing the complementary transistor pairs. Additionally, the gate contact runs beneath the surface, in the isolation region. This aspect of the structure similarly aids in providing a higher density on the wafer surface. The method of fabrication is such that the desired structure is completed without adding costly fabrication steps. The structure and method yield an inverter suited for multifarious integrated circuit designs. Once fabricated the inverter may be hooked up according to circuit design choice.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the invention, reference is made to the accompanying drawings which form a part hereof and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

Figure 1:
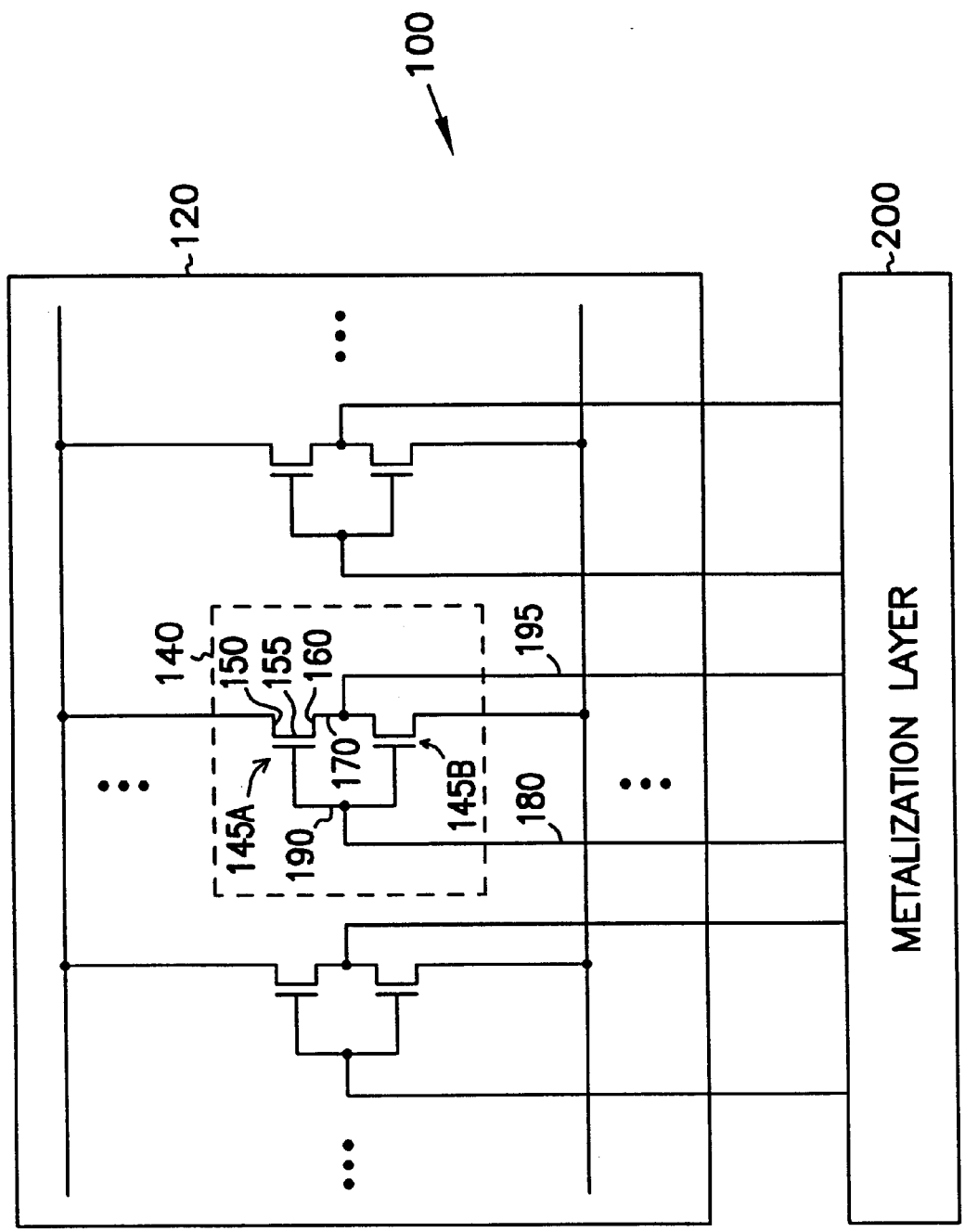
FIG. 1 is schematic diagram illustrating an inverter array included as part of a logic circuit according to the teachings of the present invention.

FIG. 1 is a schematic diagram illustrating an inverter array 120 included as part of a logic circuit 100. Inverter 140 includes a pair of differently doped transistors 145A and 145B. The first transistor 145A is a p-channel metal-oxide semiconductor transistor (PMOS) and the second transistor 145B is an n-channel metal-oxide semiconductor transistor (NMOS).

In FIG. 1, each transistor in the pair of differently doped transistors 145A and 145B includes a first source/drain region 150 of a first type conductivity material, a body region 155 of a second conductivity type material and a second source/drain region 160 of the first conductivity type material. In one embodiment, the first source/drain region 150 of first transistor 145A of the pair of differently doped transistors 145A and 145B comprises p+ silicon material. Also, each pair of oppositely doped transistors 145A and 145B are coupled together via an electrical contact 170 at their respective second source/drain regions 160. Each inverter 140 includes a connection to an electrical input 180 which couples to a gate contact 190. The electrical contact 170 also couples to an electrical output 195.

In one embodiment, the electrical inputs 180 and electrical outputs 195 of selected inverters 140 can be interconnected. The selected interconnection is made through a patterned metallization layer 200 which is coupled to inputs and outputs of selected inverters. The order of interconnection of the inverters will determine the output of logic circuit 100. The metallization layer 200 can be configured to perform basic boolean logic functions such as AND, OR and NOT functions. By order of arrangement, the basic boolean logic functions can be combined such that the logic circuit 100 yields desired logic functions.

Figure 2:
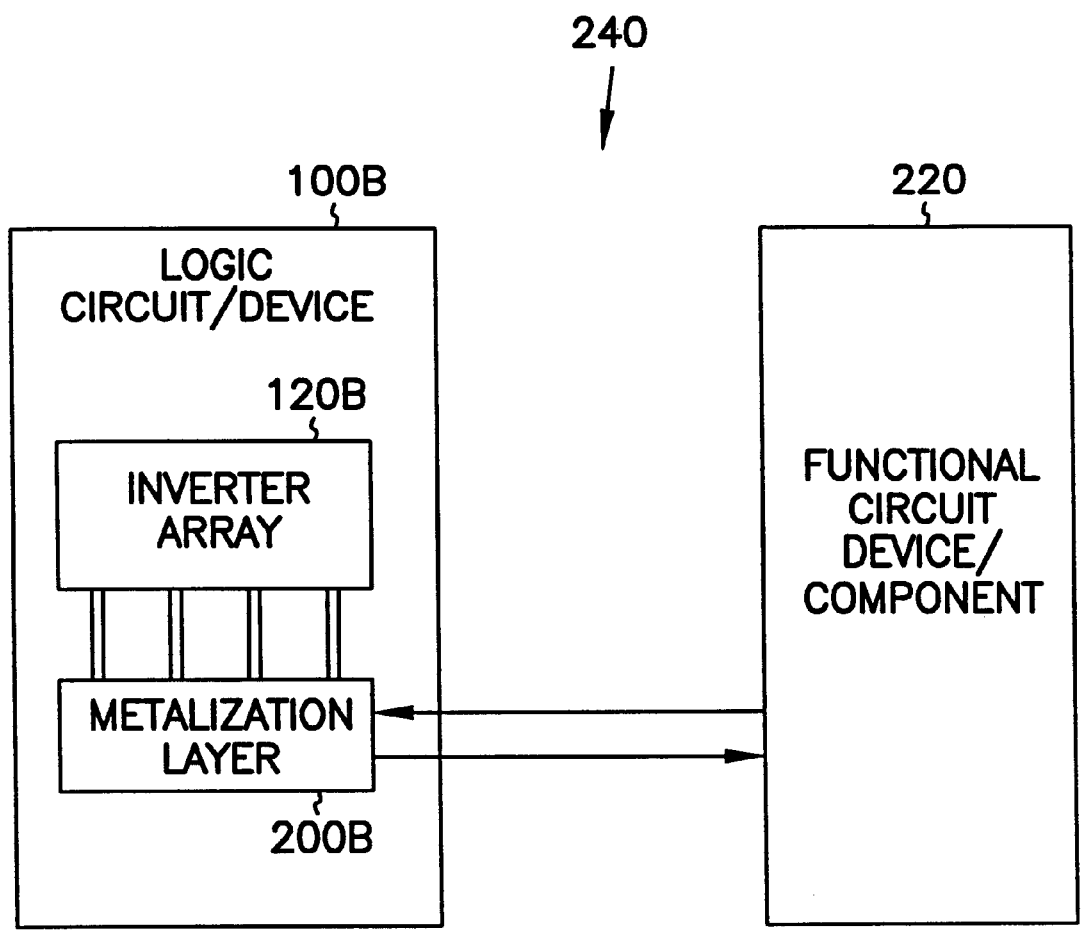
FIG. 2 is a block diagram illustrating a functional circuit according to the teachings of the present invention.

FIG. 2 illustrates the use of an inverter array 120B in a functional circuit 240. The individual inverters within the inverter array 120B are selectively interconnected. The selected interconnection is made through a patternized metallization layer 200B which is coupled to inputs and outputs of selected individual inverters. The selected interconnection of individual inverters in the inverter array 120B through the metallization layer 200B forms logic circuit/device 100B. The logic circuit/device 100B is electrically interconnected to other functional circuit device/components 220. These other functional circuit devices/components include memory controllers, microprocessors and input/output bus units.

Figure 3:
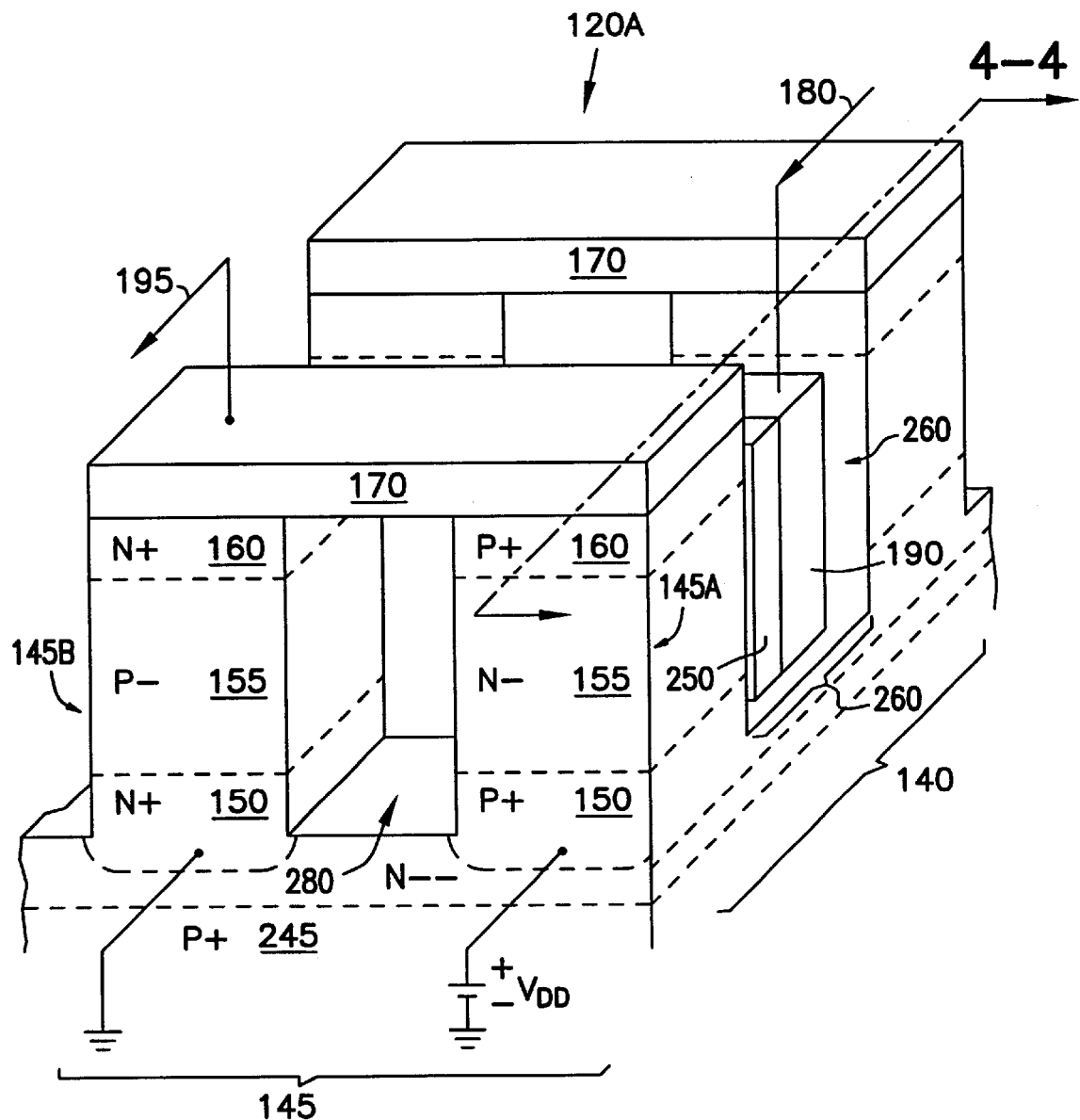
FIG. 3 is a perspective view illustrating generally an embodiment of a portion of a CMOS inverter array according to the present invention.

FIG. 3 is a perspective view illustrating generally an embodiment of a portion of an inverter array 120A including CMOS inverters 140, wherein the inverters include electrical inputs 180 and electrical outputs 195. Inverter array 120A can be used in logic circuit 100 of FIG. 1 and in the broader functional circuit 240 of FIG. 2. Each of inverters 140 has a substantially identical structure, and accordingly, only one inverter 140 is described herein.

FIG. 3, illustrates a first transistor 145A formed in a first pillar of single crystalline semiconductor material that extends outwardly from the substrate 245. The pillar has a number of sides. The first transistor 145A has a body region 155 and first and second source/drain regions, 150 and 160 respectively, that are vertically aligned. The first transistor 145A includes a gate 250 that is associated with a side of the first transistor. A second transistor 145B is formed in a second pillar of single crystalline semiconductor material that extends outwardly from the substrate 245. The pillar has a number of sides. The second transistor 145B has body region 155 and first and second source/drain regions, 150 and 160 respectively, that are vertically aligned within the second pillar. The second transistor 145B has a gate 250 that is associated with a side of the second transistor. The transistors 145A and 145B comprise the complementary pair of transistors 145.

One skilled in the art will recognize that substrate 245, is typically formed from either bulk silicon starting material, semiconductor-on-insulator (SOI) starting material, or SOI material that is formed from a bulk semiconductor starting material during processing. In this embodiment, using bulk silicon processing techniques, a first transistor 145A includes a p+ silicon layer formed on a bulk silicon substrate 245 to produce first source/drain region 150. An n− silicon layer is formed on the p+ first source/drain region 150 to form the body region 155 of first transistor 145A. A p+ silicon layer is formed on the n− body region 155 to produce second source/drain region 160. A second transistor 145B includes an n+ silicon layer formed on a bulk silicon substrate 245 to produce first source/drain region 150 of second transistor 145B. A p− silicon layer is formed on the n+ first source/drain region 150 to form the body region 155 of second transistor 145B. An n+ silicon layer is formed on the p− body region 155 to produce second source/drain region 160. In an alternative embodiment, the doping order of the layers in the complementary pair of transistors 145 is reversed.

The gate contact 190 couples gates 250 of the complementary pair of transistors 145A and 145B. An electrical contact 170 couples second source/drain region 160 of first and second transistors, 145A and 145B respectively.

A plurality of isolation trenches 260 extend parallel to and separate the multiple complementary pairs of transistors 145A and 145B. The gate contact 190 and gates 250 of the complementary pair of transistors 145, are located in an isolation trench 260 below the top surfaces of the complementary pair of transistors 145.

Columns of first and second transistors, 145A and 145B respectively, are alternately disposed (interdigitated) within the inverter array 120. Isolation trench 260 provides isolation between first and second transistors, 145A and 145B respectively, of the pair of transistors 145. Multiple complementary pairs of transistors 145 are separated by isolation trenches 260 wherein the gate contact 190 and gates 250 of the complementary pair of transistors 145 are interposed.

In one embodiment, gate material 250 is alternately formed of p+ polysilicon on first transistor 145A and formed of n+ polysilicon on second transistor 145B. The gate contact 190 is formed of a refractory metal, such as tungsten or titanium. Alternatively, other suitable conductors may be used for the gate contact 190.

In operation, inverter 140 receives a "high" or "low" voltage input corresponding to a logic "1" or logic "0". The voltage input is coupled to the gate contact 190 via the electrical input 180. This input on the gate contact 190 causes the formation of a conductive inversion channel in body region 155 of either the first or second transistors, 145A and 145B respectively, depending on the received voltage potential. In turn, the creation of an inversion channel in the body region 155 of either the first or second transistors, 145A and 145B respectively, facilitates conduction between the first and the second source/drain regions 150 and 160 within the same transistor. The first source/drain region 150, of both the first and second transistors, 145A and 145B respectively, are both electrically connected to external potential levels. The potential level connected to the conducting first source/drain region 150 is thus transmitted to the electrical output 195 via the electrical contact 170 which is coupled to the second source/drain regions 160 of the complementary pair of transistors 145.

In one embodiment, an applied potential of $V_{DD}$ is coupled to the first source/drain region 150 of the first transistor 145A of the complementary pair of transistors 145. The first source/drain region 150 of the second transistor 145B of the complementary pair of transistors 145 is coupled to ground. In this embodiment, when a "high" voltage potential or logic "1" is applied to the gate contact 190, via the electrical input 180, an inversion channel forms in the body region 155 of the second transistor 145B. Conduction occurs between the first and second source/drain regions, 150 and 160 respectively, and the second transistor 145B outputs ground or a logic "0".

Figure 4:
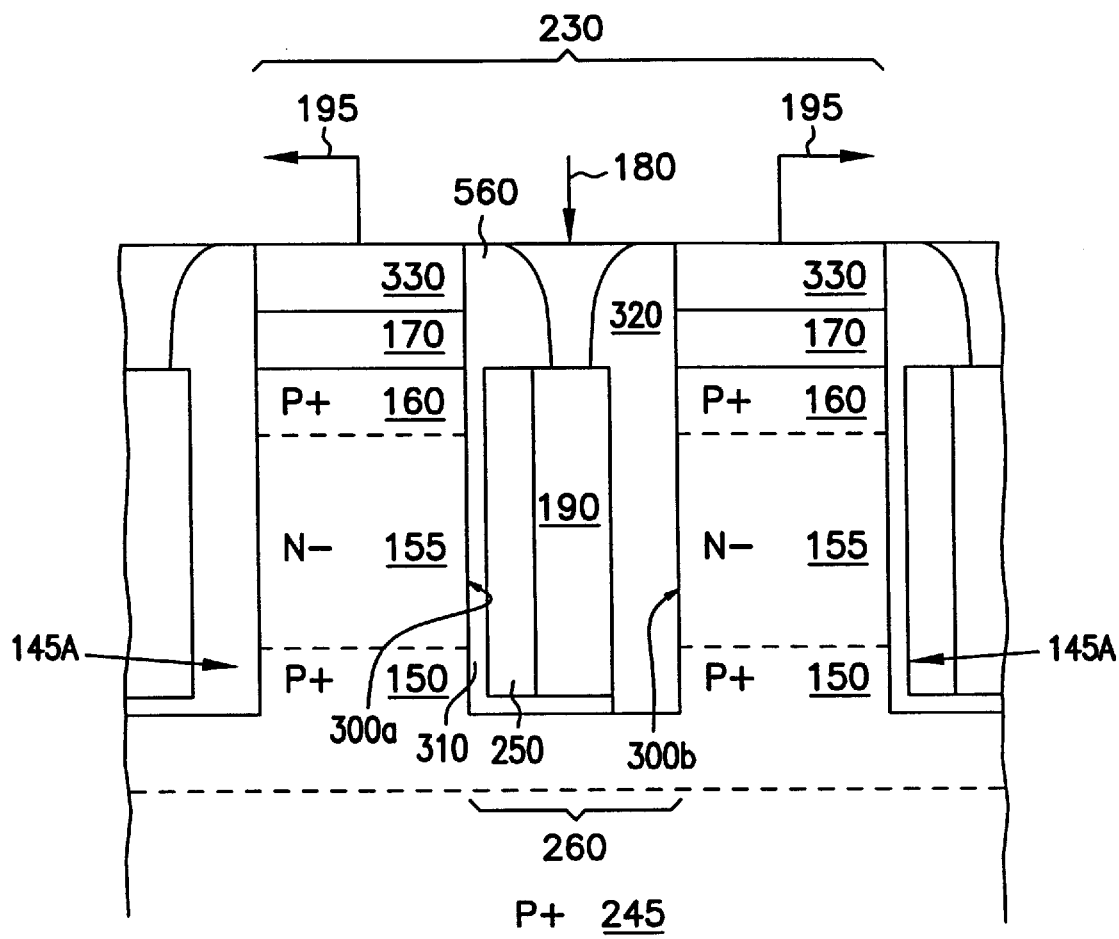
FIG. 4 is a cross-sectional view taken along cut line 4—4 of FIG. 3.

FIG. 4 is a cross-sectional view taken along the cut line 4—4 of FIG. 3. FIG. 4 illustrates a portion of the inverter array 120. In FIG. 4, gate contact 190 is illustrated buried below the active top surface 230 of the complementary pairs of transistors 145. Top surface 230 represents an upper semiconductor portion of the complementary pairs of transistors 145. FIG. 4 illustrates the electrical contact 170 to the second source/drain region 160 of the first transistor type 145A. Gate contact 190 connects to the gate material 250. The gate material 250 is in turn capacitively coupled to the body region 155 of the first transistor type 145A. An oxide layer 310 serves as the dielectric between the gate material 250 and the body region 155 and is sandwiched between them along vertical sidewall 300a of the isolation trench 260. Gate contact 190 is isolated from vertical sidewall 300b of the isolation trench 260, and the corresponding body region 155 of a subsequent column by an oxide collar 320.

Burying the gate contact 190 below the active top surface 230 of the complementary pairs of transistors 145 is an aspect of the invention which provides higher structure density on a chip's surface. Vertically configuring the first and second transistor types, 145A and 145B respectively, is another aspect of the invention yielding high density on a chip's surface. Electrical input 180 is illustrated in FIG. 4 coupled to the gate contact 190. Electrical output 195, as illustrated in FIG. 4, couples to the top of electrical contact 170. There is a nitride cap 330 located on the electrical contact 170. Both input and output can be made from among conventional process steps for contact hole etching and wiring. The electrical input 180 is separated from the electrical output 195 by the nitride cap 330.

Figure 5A:
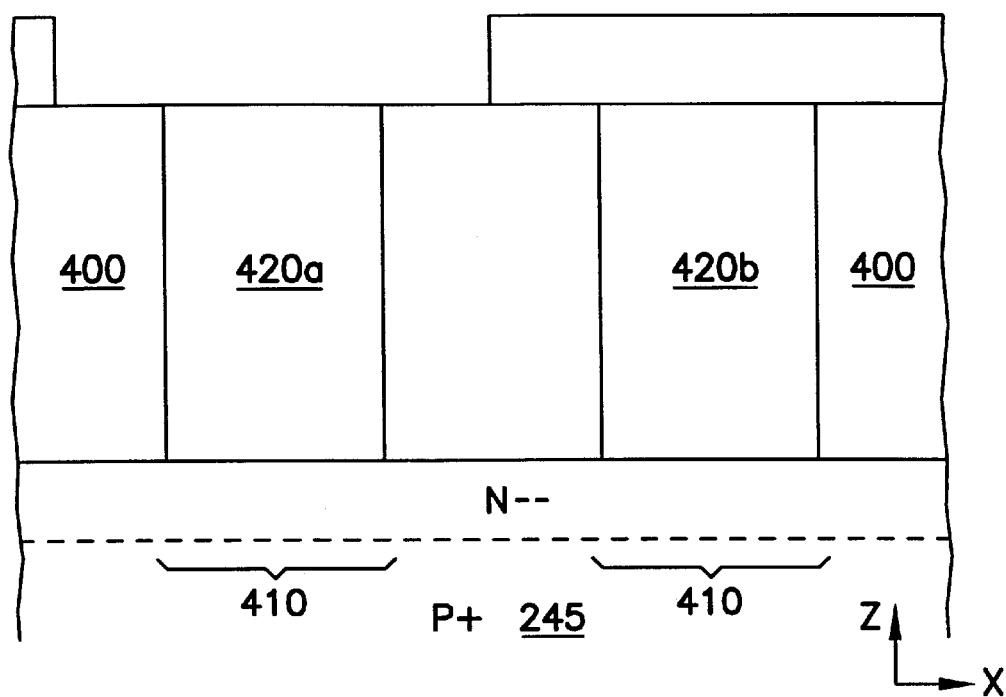
FIGS. 5A–5M illustrate an inverter array at various stages of an embodiment of a fabrication process.

FIGS. 5A–5M, describe generally the various processing techniques of one embodiment of a vertically configured silicon structure as in that of the first and second transistor type, 145A and 145B respectively, in the complementary pair of transistors 145 which form the inverter 140. In the embodiment of FIG. 5A, the starting silicon substrate 245 is p+ with a 0.3 micrometer (μm) n—surface layer. A silicon nitride ($Si_3N_4$) layer 400 is formed on a bulk silicon substrate 245 such as by chemical vapor deposition (CVD). The overall thickness of the nitride layer 400 can be approximately between 0.6–0.8 micrometers (μm). A photoresist is applied and selectively exposed to provide a mask for the directional etching of trenches 410. The directional etching, performed by reactive ion etching (RIE), transforms the nitride layer 400 into a plurality of nitride columns 400. The photoresist is removed. Oxide layers 420a and 420b are formed, such as by CVD of silicon dioxide ($SiO_2$). The oxide layers 420a and 420b are applied to fill the trenches 410 and then the working surface is planarized, such as by chemical mechanical polishing/planarization (CMP).

A photoresist is applied and selectively exposed to provide a mask to cover alternate oxide layers 420a and 420b located in the trenches 410. The unmasked oxide layers 420a, or in an alternate pass, layers 420b, are etched from the trenches 410. This previous step produces a plurality of alternately vacant trenches 410. Next, the photoresist is removed, such as by conventional photoresist stripping techniques.

Figure 5B:
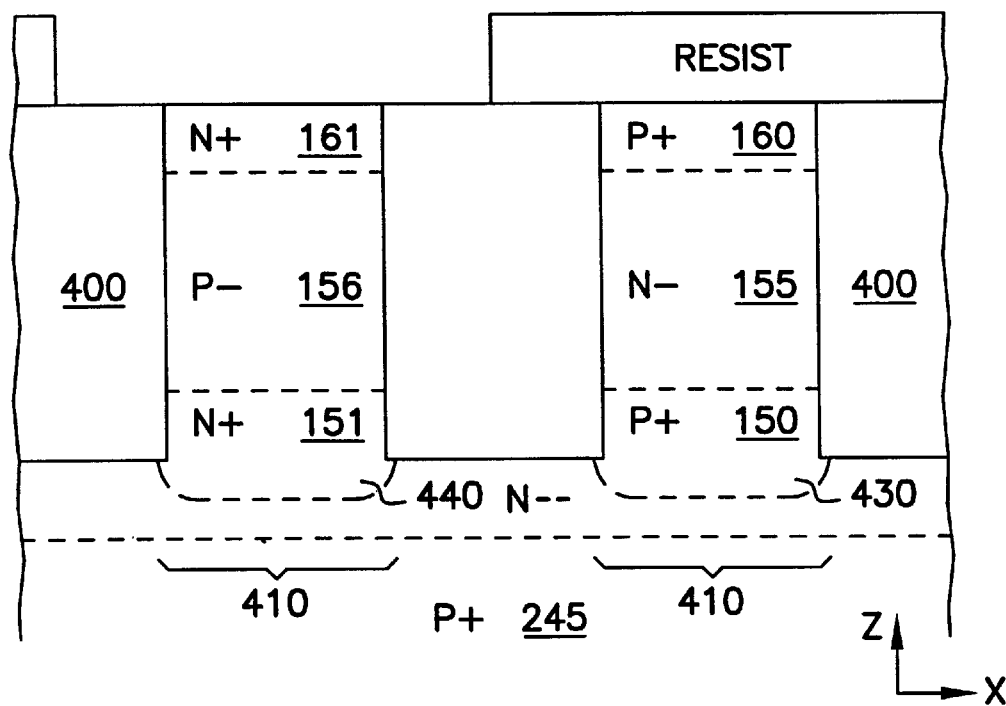

FIG. 5B illustrates the structure after the next sequence of process steps. A p+ layer 150 is formed by ion-implantation of boron into substrate 245 and epitaxial growth of p+ semiconductor material. The overall thickness of the composite first source/drain layer 150 can be approximately 0.1 micrometers (μm). A body region 155 of n– silicon is formed by epitaxial growth to a thickness of approximately 0.3 μm. A second source/drain layer 160 of p+ silicon is formed by epitaxial growth on the body region 155. The thickness of the second source/drain layer 160 is approximately 0.2 μm. The resulting column is a first vertically configured semiconductor structure 431.

A nitride cap 401 is applied through CVD and then planarized to expose the remaining oxide layer 420b filled in the trenches 410. The remaining oxide layers 420b are etched from the trenches 410.

An n+ layer 151 is formed by ion-implantation of phosphorous or arsenic in substrate 245 and epitaxial growth of n+ semiconductor material. The overall thickness of the composite first source/drain layer 151 is approximately 0.1 μm. A body region 156 of p– silicon is formed by epitaxial growth to a thickness of approximately 0.3 μm. A second source/drain layer 161 of n+ silicon is formed by epitaxial growth on the body region 156. The thickness of the second source/drain layer 161 is approximately 0.2 μm. The resulting column is a second vertically configured semiconductor structure 432.

Figure 5C:
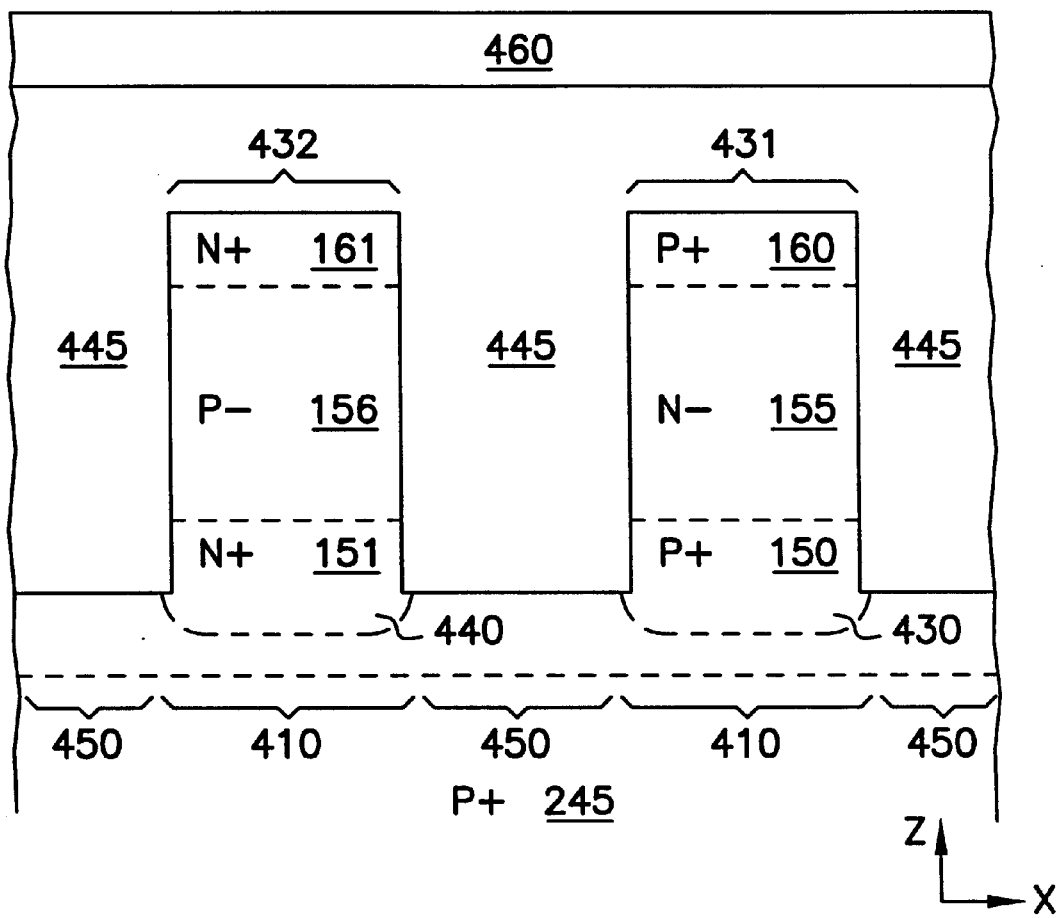

FIG. 5C illustrates the structure after the next series of process steps. All of the nitride layer 400 and the nitride cap 401 is stripped. The nitride layer 400 and cap 401 can be wet stripped using phosphoric acid. A new oxide layer 445, such as silicon dioxide ($SiO_2$), is deposited by CVD to fill the trenches 450, created by the nitride removal. The oxide layer 445 is planarized by CMP. A nitride cap 460 is formed on the oxide layer 445 by CVD. The thickness of the nitride cap is approximately 0.1 μm.

Figure 5D:
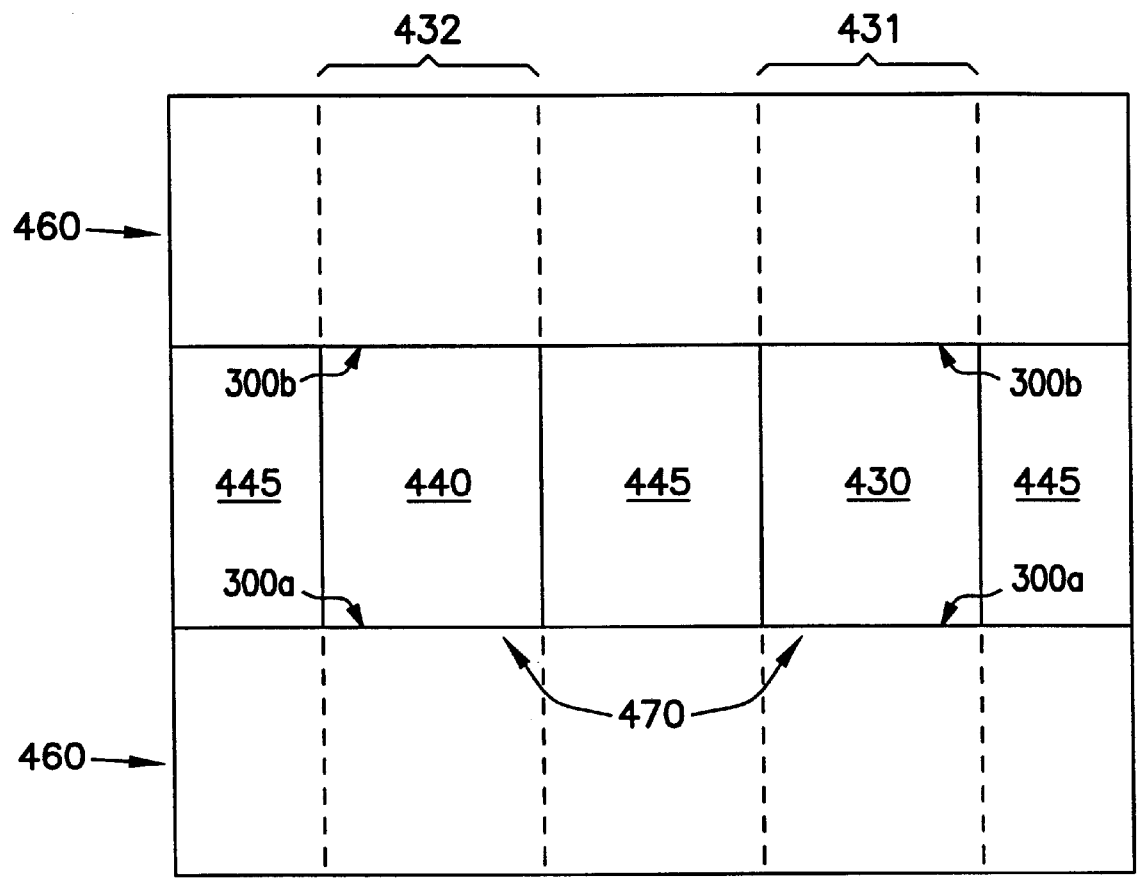

FIG. 5D is a top view illustrating the structure after the next sequence of steps. A photoresist is applied and selectively exposed to provide a mask which defines a minimum dimension stripe pattern orthogonal to the columns of vertically configured semiconductor material 431 and 432. The nitride cap 460 and the oxide layer 445 are etched through, such as by RIE, to the point where the top surface of the columns of vertically configured semiconductor material, 431 and 432 respectively, are exposed. The photoresist is removed by conventional photoresist stripping techniques. The exposed columns of vertically configured semiconductor material are selectively etched to expose the p+ layer 150 and the n+ layer 151, creating a plurality of cavities 470 having vertical sidewalls 300a and 300b. The structure is now as shown in FIG. 5D.

Figure 5E:
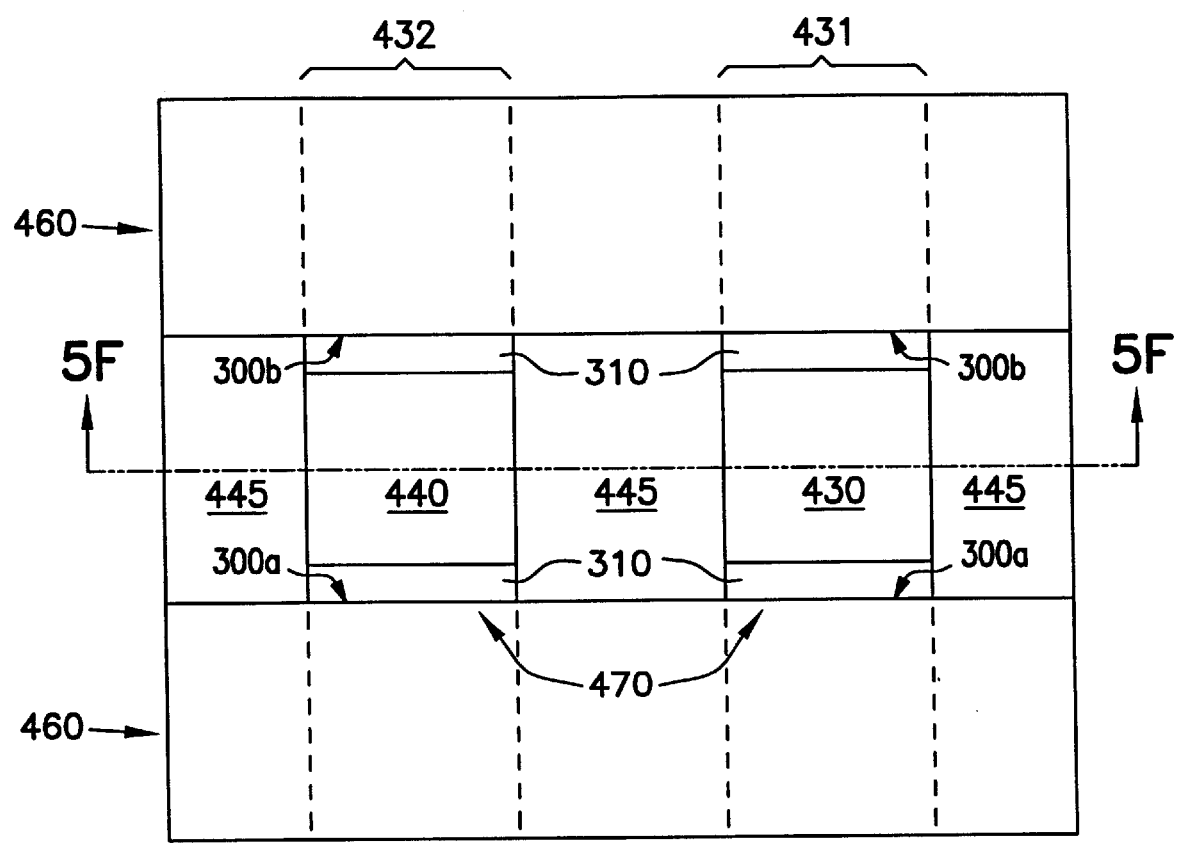

FIG. 5E illustrates the structure following the next set of fabrication steps. An oxide layer 310 is thermally grown on the exposed semiconductor surfaces. The exposed semiconductor surfaces include the p+ and n+ layers 150 and 151 respectively, and the vertical sidewalls 300a and 300b respectively, of the cavities 470.

Figure 5F:
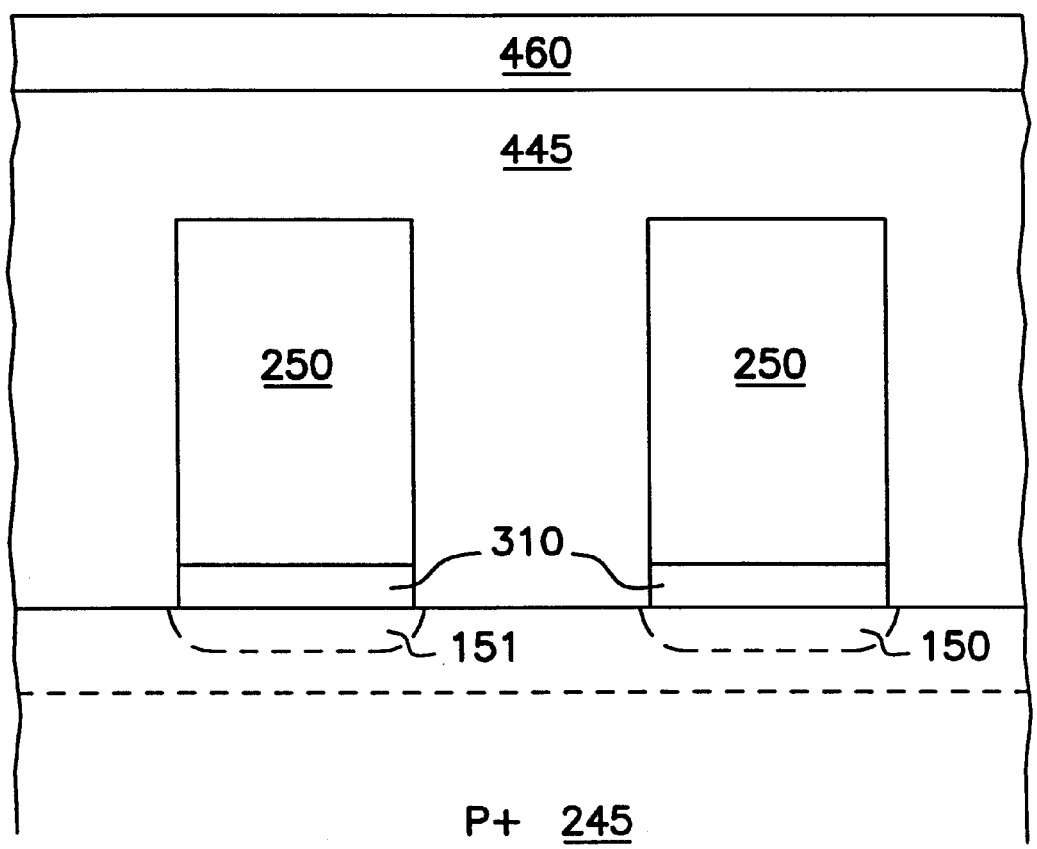

FIG. 5F illustrates a cross-sectional view of FIG. 5E, along cut line 5F—5F. A gate material 250a and 250b is deposited in the cavities 470 by the process of CVD. The gate material 250a and 250b is deposited until the cavities 470 are filled. In one embodiment, the gate material 250a is an n+ polysilicon material for NMOS devices, and gate material 250b is a p+ polysilicon gate material for PMOS devices. In another embodiment, an n+ polysilicon gate material is deposited in all of the cavities 470. The portion of the oxide layer 310 sandwiched between the gate materials 250a and 250b and the vertical sidewalls 300a and 300b serves as a gate oxide.

Figure 5G:
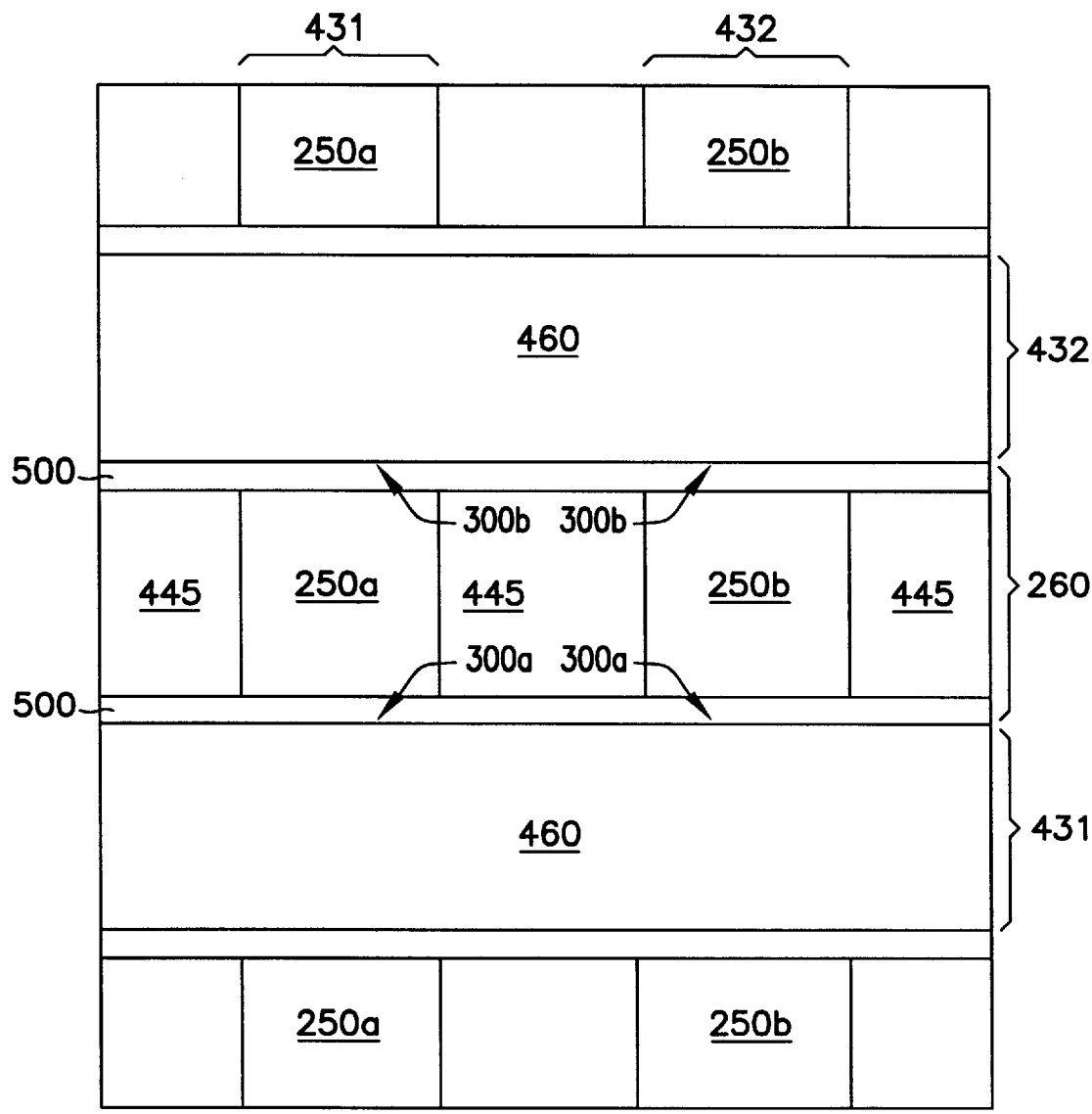

FIG. 5G once again is a top view, like that in FIG. 5E. FIG. 5G illustrates the first of several steps to form the isolation trench 260. An isolation trench 260 is formed which separates the columns of vertically configured semiconductor material, 431 and 432 respectively. The n+ and p+ gate materials, 250a and 250b respectively, are recess etched, such as by reactive ion etching (RIE) to below the top of the columns of vertically configured semiconductor material, 431 and 432 respectively. An additional nitride spacer layer 500 is deposited, such as by CVD. The nitride spacer layer 500 is etched to leave on the sides of thick nitride cap 460. The additional nitride layer 500 conceals the oxide layer 310 (not shown) from view. In one embodiment, nitride spacer layer 500 is etched by reactive ion etching (RIE).

Figure 5H:
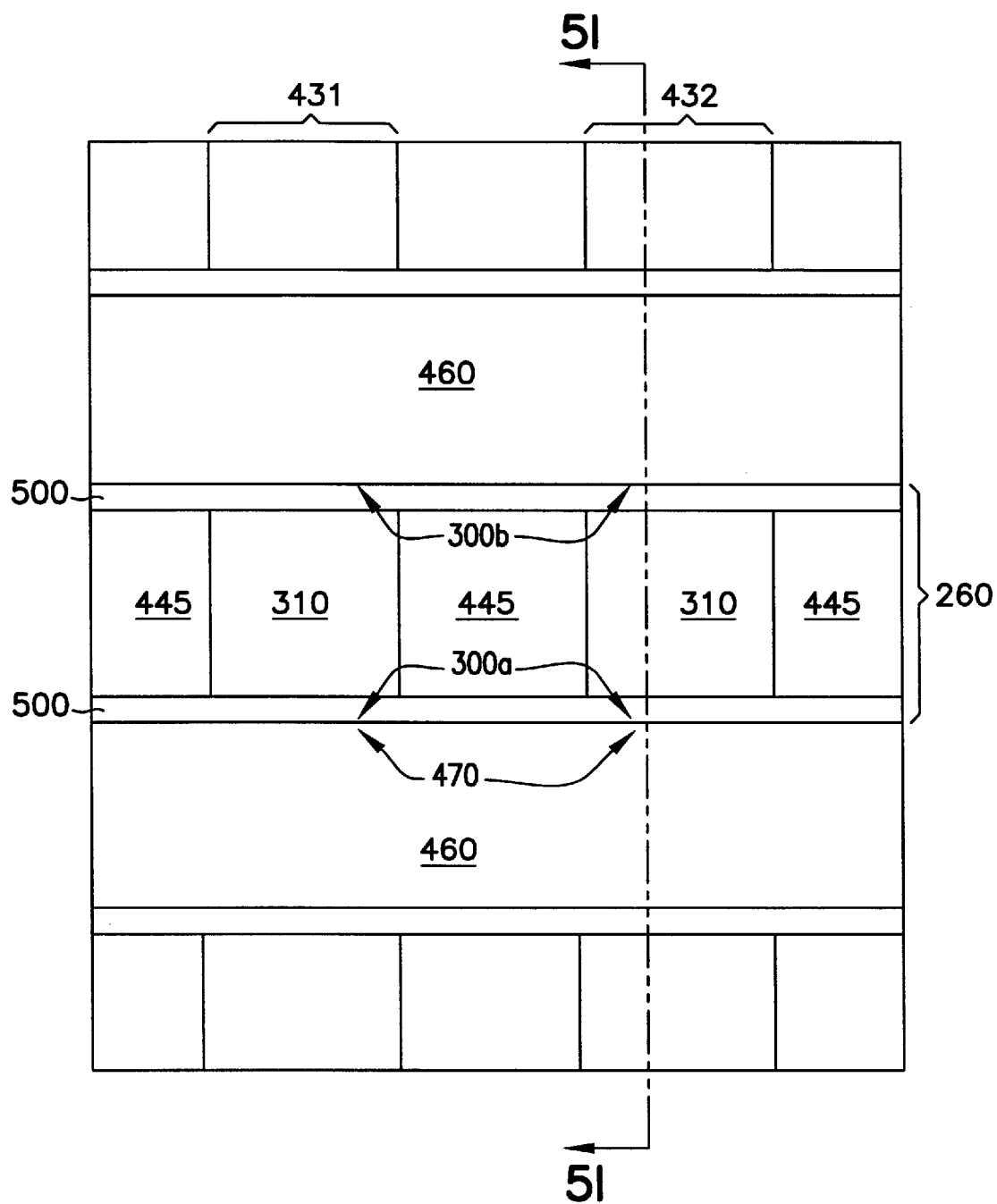

FIG. 5H is a top view illustrating the next several steps associated with forming the isolation trench 260. A photoresist is applied and exposed to form a mask which reveals only those oxide regions 445 which lie between the n+ and p+ gate materials, 250a and 250b respectively, and thus protects oxide outside of inverter area. The exposed oxide 445 is selectively etched through an RIE process. The etching is to be timed to reach a sufficient depth to provide access for gate contact conduction, but not to a depth which reaches the substrate 245. The oxide layer (not shown) on the vertical sidewalls 300a and 300b respectively, is covered from view by the nitride spacer layer 500. Next, the n+ and p+ gate materials (not shown), 250a and 250b respectively, are selectively etched using the overhanging nitride spacer layer 500 as a mask. This step leaves n+ and p+ polysilicon gate material (not shown), 250a and 250b respectively, on opposing vertical sidewalls 300a and 300b. The n+ and p+ gate materials (not shown), 250a and 250b, are also obstructed from view in this top view by the nitride spacer layer 500. The selective etching is timed to a sufficient depth to stop on the oxide layer 310 on the bottom of the originally formed cavities 470. The structure is now as it appears in FIG. 5H.

Figure 5I:
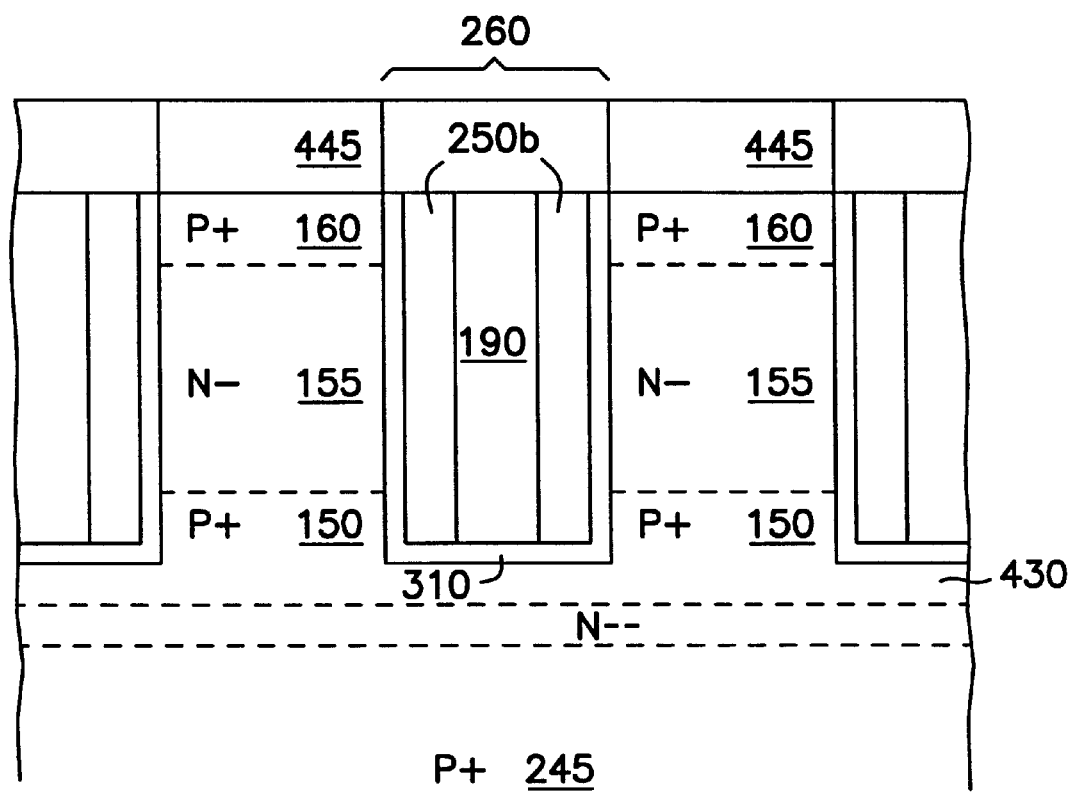

Next, the nitride spacer layer 500 and nitride cap 460 are stripped. FIG. 5I illustrates the structure after the next series of steps, viewed along the cut line 5I—5I of FIG. 5H. A gate contact 190 is deposited by CVD to fill the isolation trench 260. In one embodiment, the gate contact is tungsten. In another embodiment, the gate contact 190 is any other suitable refractory metal. The gate contact 190 is recessed through an RIE process to approximately the level of the top of the complementary pair of transistors 145, and likewise to a sufficient depth to expose the tops of the n+ and p+ gate materials, 250a and 250b respectively.

Figure 5J:
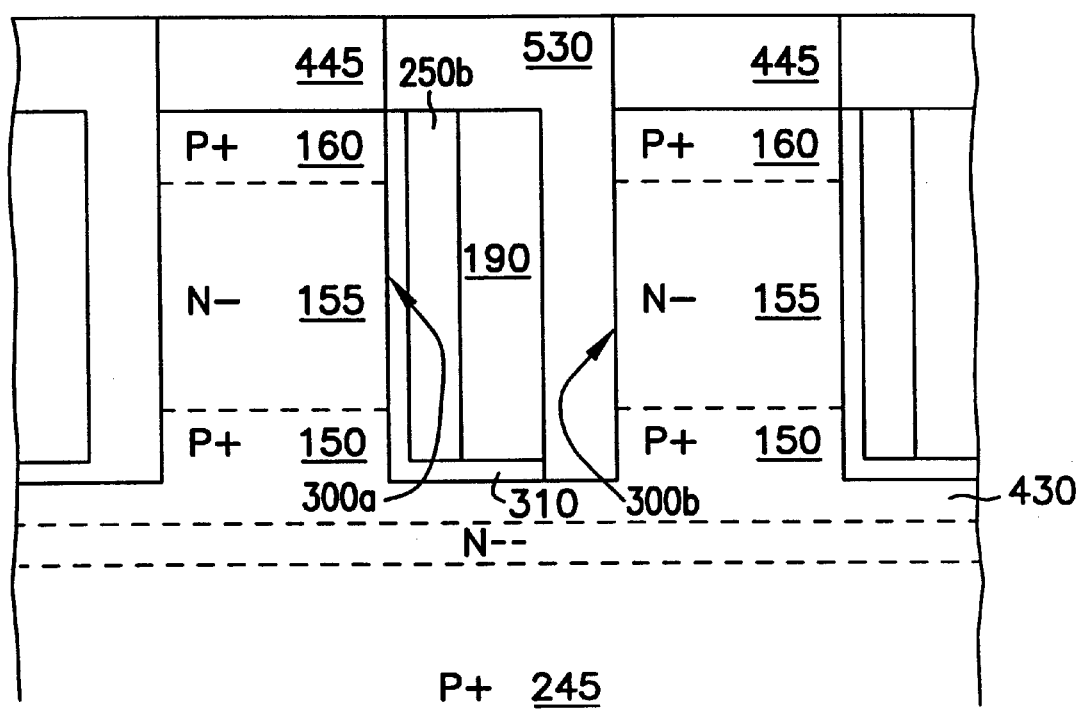

FIG. 5J illustrates the same view after the next sequence of steps. A photoresist is applied and exposed to create a mask of open strips over one side of the isolation trench 260 for removing n+ and p+ gate material, 250a and 250b respectively, from one of the vertical sidewalls 300a or 300b. In one embodiment, the n+ and p+ gate material, 250a and 250b respectively, as well as portions of the oxide layer 310, are selectively etched to remove from the vertical sidewall 300b. The photoresist is removed. An intrinsic polysilicon layer 530 is deposited to fill space left by the removal of the gate material 250a and 250b and oxide layer 310 from along sidewall 300b. Intrinsic polysilicon layer 530 can be applied through CVD processes. The intrinsic polysilicon layer 530 is then planarized by CMP.

Figure 5K:
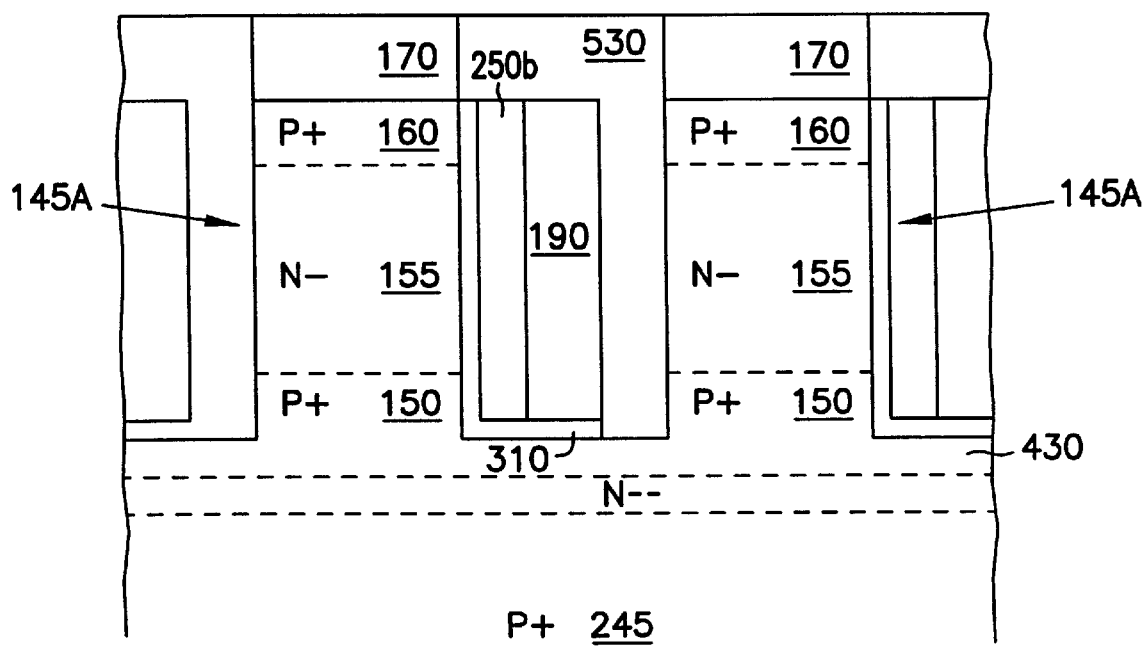

In FIG. 5K, the structure is presented following the next sequence of steps in the fabrication process. A photoresist is applied and exposed to define a mask in the form of an electrical contact 170. The electrical contact 170 is to connect the first and second transistor, 145a and 145b respectively (145b not shown), of the complementary pairs of transistors 145. In one embodiment, the electrical contact connects the second source/drain regions, 160 and 161 respectively, of the first and second transistors, 145a and 145b (145b not shown). The oxide layer 445 is selectively etched to expose the underlying second source/drain regions, 160 and 161. The etching is performed by any number of conventional etching processes, such as RIE. Then, the photoresist is removed and the electrical contact 170 is deposited. The electrical contact 170 is a metal such as tungsten (W) or titanium (Ti). However, in an alternate embodiment, other forms of conductors with similar conduction properties may be used. At this point, the electrical contact 170 is planarized until even with the intrinsic polysilicon layer 530. The structure is now as it appears in FIG. 5K.

Figure 5L:
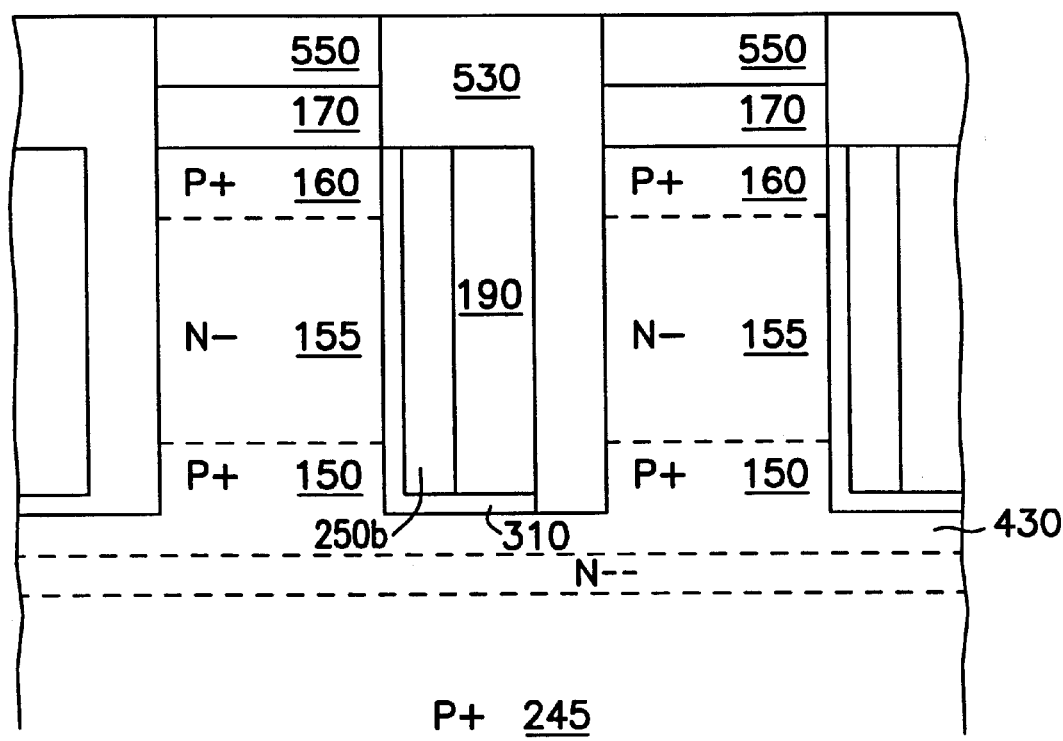

In FIG. 5L, the structure is shown after another set of fabrication steps is completed. The electrical contact 170 is recessed by RIE methods to approximately 0.05–0.1 $\mu$m. A layer of nitride 550 is formed upon the electric contact. The nitride layer is approximately 0.15 $\mu$m in thickness and deposited by CVD. CMP is used once more to planarize, leaving the nitride layer 550 on top of the electrical contact 170.

Figure 5M:
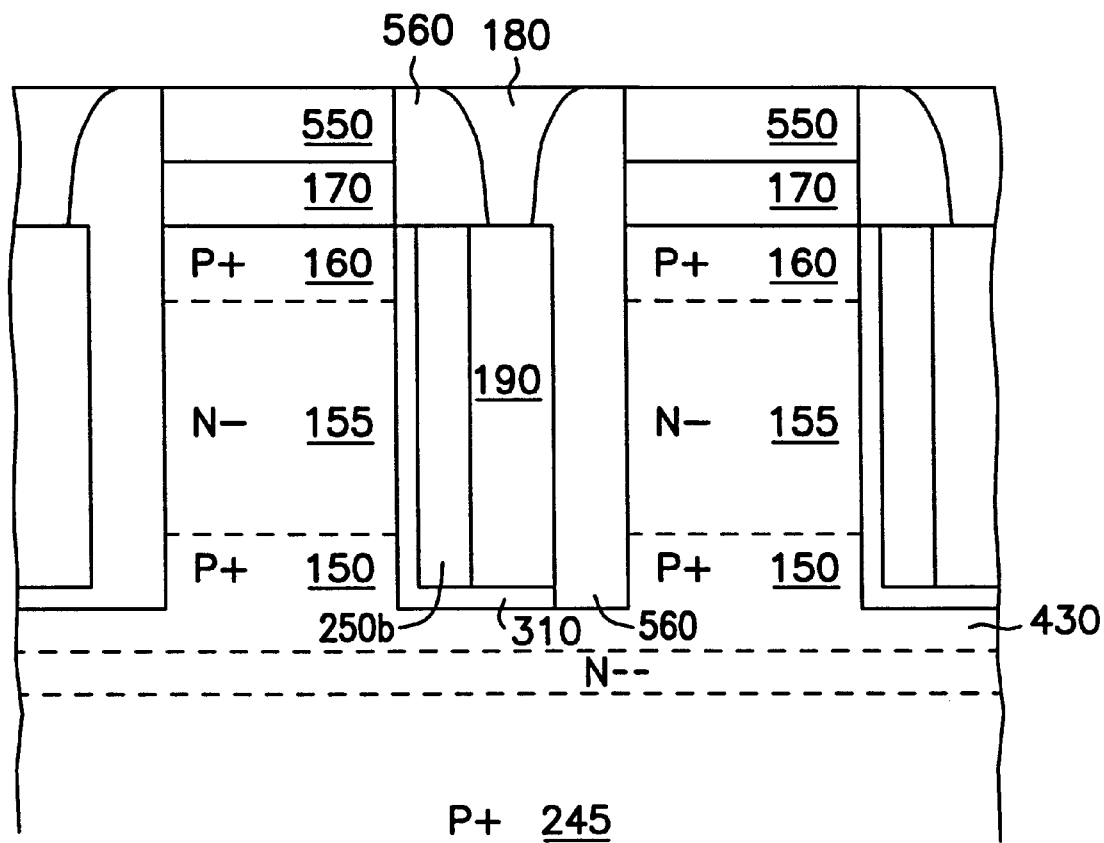

FIG. 5M shows the completed structure following the final sequence of process steps. A photoresist is applied and exposed to form a mask which is to define an electrical input 180 to the gate line contact 190. The intrinsic polysilicon layer 530 is etched from the isolation trench 260. Oxide spacers 560 are deposited, such as by CVD, and directionally etched in order to form a collar shape for the electrical input 180. Next, an electrical input 180 is deposited by CVD. In one embodiment, the electrical input 180 comprises a refractory metal. In an alternative embodiment, the electrical input 180 comprises polysilicon. The external wiring, including the contact hole etching necessary to form an electrical output 195 (not shown), can be achieved by the use of conventional process steps well known to those skilled in the art. The electrical output 195 (not shown) connects with the electrical contact 170.

Conclusion

A CMOS inverter is provided, capable of combination with similar inverters to form an inverter array. The array of inverters can be further combined with a metallization layer to form a logic circuit and to external components to form a functional circuit. The inverter has vertically configured pillars of silicon material extending outwardly from a semiconductor substrate. The pillars have both NMOS and PMOS transistors. A gate contact is provided below the active top surface of the vertical pillars. This construction conserves precious chip space and allows the inverter to be fabricated in a minimal area. Once constructed the inverter may be hooked up to other devices and employed in any conventional logic and functional circuit. A method of fabrication is provided to construct the above inverter in vertical pillars of single crystal polysilicon.

It is to be understood that the above description is intended to be illustrative, and not restrictive. Combinations of the above embodiments, and other embodiments will be apparent to those of skill in the art upon reviewing the above description. The above structures and fabrication methods have been described, by way of example, and not by way of limitation, with respect to the transistors and inverters. However, the scope of the invention includes any other integrated circuit applications in which the above structures and fabrication methods are used. Thus, the scope of the invention is not limited to the particular embodiments shown and described herein. The scope of the invention should be determined with reference to the appended claims, along with the full scope of equivalents to which such claims are entitled.

What is claimed is:

1. An inverter, comprising:
   a first vertically configured transistor formed within a first vertically configured structure extending outwardly from a semiconductor substrate;
   a second vertically configured transistor formed within a second vertically configured structure extending outwardly from a semiconductor substrate;
   an electrical contact between source/drain regions of the first and second vertically configured transistors to provide an output for the inverter; and
   a single gate contact located in an isolation trench below a top surface of the first and the second vertically configured transistors, the gate contact interconnecting and shared between the vertically configured transistors wherein the gate contact comprises an input to the inverter.

2. The inverter of claim 1, wherein:
the first vertically configured transistor comprises a first transistor type having a number of sides, the first transistor having a body region and first and second source/drain regions; the first transistor further having a gate that is associated with a side of the first transistor; and
the second vertically configured transistor comprises a second transistor type having a number of sides, the second transistor having a body region and first and second source/drain regions, the second transistor further having a gate that is associated with a side of the second transistor.

3. The inverter of claim 2, wherein the gate contact interconnects the gates of the first and second transistors.

4. The inverter of claim 2, wherein the electrical contact between first and second transistors is a tungsten shunt that interconnects an outer source/drain region of the first and second transistors.

5. The inverter of claim 2, wherein the body region and first and second source/drain regions of the second transistor are oppositely doped from the corresponding body region and first and second source/drain regions of the first transistor.

6. An inverter on a semiconductor substrate, comprising:
a first transistor formed in a first pillar of single crystalline semiconductor material that extends outwardly from the substrate, the pillar having a number of sides, the first transistor having a body region and first and second source/drain regions that are vertically aligned, the first transistor further having a gate that is associated with a side of the first transistor;
a second transistor formed in a second pillar of single crystalline semiconductor material that extends outwardly from the substrate having a number of sides, the second transistor having a body region and first and second source/drain regions formed within the second pillar, the second transistor further having a gate that is associated with a side of the second transistor, wherein the transistors comprise a complementary pair;
a gate contact buried below an active top surface of the first and the second transistors that is in communication with the body regions of both first and second transistors; and
a metal shunt forming an electrical contact between the first and second transistors.

7. The inverter of claim 6, wherein the first source/drain region of first transistor comprises a p+ silicon material.

8. The inverter of claim 6, wherein the first source/drain region of first transistor comprises n+ silicon material.

9. An inverter array, comprising;
multiple complementary pairs of transistors extending outwardly from a semiconductor substrate and having upper surfaces, each transistor in a pair having a vertically stacked body region and first and second source/drain regions, each transistor further having a gate;
an electrical contact between the second source/drain regions of the transistors in each complementary pair;
a plurality of isolation trenches extending parallel to and separating the multiple complementary pairs of transistors and between each transistor; and
a gate contact for each complementary pair of transistors, wherein the gate contact is buried below an active top surface of each complementary pair of transistors, wherein the gate contact is shared between the complementary pair of transistors and wherein the gate contact communicates with the body region of each transistor in the complementary pair.

10. The inverter array of claim 9, wherein the electrical contact couples the second source/drain regions of the transistors in the complementary pair.

11. The inverter array of claim 10, wherein the electrical contact is a tungsten shunt.

12. The inverter array of claim 11, wherein the electrical contact further includes an output to other ones of the multiple complementary pairs of transistors.

13. The inverter array of claim 12, wherein the gate contact further includes an electrical input adapted to receive electrical input from an external sources as well as other ones of the multiple complementary pairs of transistors.

14. The inverter array of claim 13, wherein the gate contact is located below the upper surface of the multiple complementary pairs of transistors.

15. An inverter array on a semiconductor substrate, comprising:
multiple complementary pairs of transistors extending outwardly from the substrate having an upper surface, and each transistor in the pair having a vertically stacked body region between first and second source/drain regions;
a gate contact for each complementary pair of transistors, the gate contact coupling to the body region of each transistor in the complementary pair, and wherein the gate contact is buried below the upper surface of the multiple complementary pairs of transistors;
an electrical input coupling to the gate contact of each complementary pair;
an electrical contact between the complementary transistors in each pair of transistors; and
an electrical output coupling to each electrical contact.

16. The inverter array of claim 15, wherein the gate contact couples to other ones of the multiple complementary pairs of transistors.

17. The inverter array of claim 15, wherein the electrical output couples to other ones of the multiple complementary pairs of transistors.

18. An integrated logic circuit, comprising:
multiple complementary pairs of transistors extending outwardly from the substrate having an upper surface, and further each transistor includes a vertically stacked body region between first and second source/drain regions;
a gate contact associated with each of the multiple complementary pairs, wherein the gate contact is shared between the complementary transistors, the gate contact coupling to the body region of each transistor in the pair, and wherein the gate contact is below the upper surface of the multiple complementary pairs of transistors, the gate contact providing an input such that each complementary pair of transistors forms an inverter;
an electrical contact between each complementary pair of transistors to provide an output such that each complementary pair of transistors forms an inverter; and
a metallization layer that selectively interconnects the inputs and outputs of the inverters to form a logic circuit that accepts inputs and produces one or more logical outputs.

19. An input/output device, comprising:

a functional circuit having a plurality of components;

a logic device coupled to the functional circuit, the logic device having at least one inverter, the inverter further comprising:
- a complementary pair of transistors extending outwardly from a semiconducting substrate, each complementary pair having an upper surface, each transistor in the complementary pair having a vertically stacked body region between first and second source/drain regions, each transistor having a gate;
- a gate contact coupling between the body region in the complementary pair of transistors in each pair, wherein the gate contact is buried below the upper surface of the multiple complementary pairs of transistors, the gate contact having an input for each inverter;
- an electrical contact between the second source/drain regions in the complementary pair of transistors in each pair, the electrical contact having an output for the inverter; and
- a metallization layer that selectively interconnects the inputs and outputs of the selected inverters in the array to implement the logical function form the functional circuit.

* * * * *

UNITED STATES PATENT AND TRADEMARK OFFICE
CERTIFICATE OF CORRECTION

PATENT NO. : 6,242,775 B1
DATED : July 25, 2001
INVENTOR(S) : Wendell P. Noble

It is certified that error appears in the above-identified patent and that said Letters Patent is hereby corrected as shown below:

Column 12, claim 13,
Line 16, "sources" should read -- source --.

Column 14, claim 19,
Line 11, "form" should read -- to form --.

Signed and Sealed this

Fifteenth Day of January, 2002

Attest:

Attesting Officer

JAMES E. ROGAN
Director of the United States Patent and Trademark Office